United States Patent
Liu et al.

(10) Patent No.: US 11,309,439 B2
(45) Date of Patent: Apr. 19, 2022

(54) PACKAGE STRUCTURE FOR SEMICONDUCTOR DEVICE, AND SEMICONDUCTOR DEVICE

(71) Applicant: HE BEI SINOPACK ELECTRONIC TECH CO., LTD., Shijiazhuang (CN)

(72) Inventors: Yao Liu, Shijiazhuang (CN); Jun Li, Shijiazhuang (CN); Jing Zhao, Shijiazhuang (CN); Jing Sun, Shijiazhuang (CN); Bin Liang, Shijiazhuang (CN); Lin Feng Zhou, Shijiazhuang (CN); Di Gao, Shijiazhuang (CN)

(73) Assignee: He Bei Sinopack Electronic Tech Co., Ltd., Shijiazhuang (CN)

( * ) Notice: Subject to any disclaimer, the term of this patent is extended or adjusted under 35 U.S.C. 154(b) by 9 days.

(21) Appl. No.: 16/970,793

(22) PCT Filed: Nov. 9, 2018

(86) PCT No.: PCT/CN2018/114830
§ 371 (c)(1),
(2) Date: Aug. 18, 2020

(87) PCT Pub. No.: WO2019/161683
PCT Pub. Date: Aug. 29, 2019

(65) Prior Publication Data
US 2021/0111285 A1     Apr. 15, 2021

(30) Foreign Application Priority Data
Feb. 22, 2018   (CN) .......................... 201810154167.1

(51) Int. Cl.
*H01L 23/055* (2006.01)
*H01L 23/08* (2006.01)
(Continued)

(52) U.S. Cl.
CPC ...... *H01L 31/02002* (2013.01); *H01L 23/055* (2013.01); *H01L 23/08* (2013.01);
(Continued)

(58) Field of Classification Search
CPC ........... H01L 31/02002; H01L 31/0203; H01L 31/024; H01L 23/055; H01L 23/08; H01L 23/10
See application file for complete search history.

(56) References Cited

U.S. PATENT DOCUMENTS

| 8,908,728 B1 | 12/2014 | Huikai et al. |
| 2004/0126066 A1* | 7/2004 | Keh ..................... G02B 6/4201 385/92 |

(Continued)

FOREIGN PATENT DOCUMENTS

| CN | 1790845 A | 6/2006 |
| CN | 104201557 A | 12/2014 |

(Continued)

*Primary Examiner* — Peniel M Gumedzoe
(74) *Attorney, Agent, or Firm* — Slater Matsil, LLP

(57) ABSTRACT

A package structure comprises a metal plate (20) where a slot is formed, a ceramic piece (60), and a metal heat sink (70) welded onto the back surface of the ceramic piece (60). The ceramic piece (60) and the metal heat sink (70) are vertically inserted into the slot and welded to the metal plate (20). A semiconductor and a matching circuit may be disposed on the metal heat sink (70). The ceramic piece (60) replaces a glass seal; metalized interconnection is provided inside the ceramic piece (60) for fabricating a metalized pattern having complex connection relations, and the electrical interconnection is more flexible. In the package structure, metalized wiring is carried out by using the ceramic piece. Compared with round lead machining, higher precision is achieved.

10 Claims, 3 Drawing Sheets

(51) Int. Cl.
*H01L 23/10* (2006.01)
*H01L 31/0203* (2014.01)
*H01L 31/024* (2014.01)
*H01L 31/02* (2006.01)

(52) U.S. Cl.
CPC .......... *H01L 23/10* (2013.01); *H01L 31/0203* (2013.01); *H01L 31/024* (2013.01)

(56) References Cited

U.S. PATENT DOCUMENTS

| | | | | |
|---|---|---|---|---|
| 2004/0247004 | A1* | 12/2004 | Keh | H01S 5/0683 |
| | | | | 372/36 |
| 2005/0013561 | A1* | 1/2005 | Kuhara | G02B 6/4243 |
| | | | | 385/92 |
| 2006/0097912 | A1* | 5/2006 | Isono | G01S 7/03 |
| | | | | 342/175 |
| 2014/0328361 | A1* | 11/2014 | Matsusue | H01L 23/3735 |
| | | | | 372/36 |

FOREIGN PATENT DOCUMENTS

| | | |
|---|---|---|
| CN | 108172633 A | 6/2018 |
| CN | 207818576 U | 9/2018 |
| JP | H0669375 A | 3/1994 |

\* cited by examiner

PACKAGE STRUCTURE FOR SEMICONDUCTOR DEVICE, AND SEMICONDUCTOR DEVICE

CROSS-REFERENCE TO RELATED APPLICATIONS

This application is a national stage application of International Application No. PCT/CN2018/114830, filed on Nov. 9, 2018, which claims priority to Chinese Patent Application No. CN201810154167.1, filed on Feb. 22, 2018. The disclosures of the aforementioned applications are hereby incorporated herein by reference in their entireties.

TECHNICAL FIELD

The disclosure belongs to the technical field of semiconductor device packaging, and particularly relates to a package structure for a semiconductor device and a semiconductor device.

BACKGROUND

The conventional circular package shell is of a metal-glass structure. With reference to FIG. 1a and FIG. 1b, the circular package shell is integrally formed of a circular metal plate 20, a glass insulator 50 and a metal lead 10. A hole is formed in surface of the circular metal plate 20, and the glass insulator 50 is welded in the hole. The metal lead 10 is welded on the glass insulator 50, and signal transmission is realized through the cylindrical metal lead 10.

A conventional optoelectronic shell employs a multilayer ceramic structure with an optical path transmission route horizontal to a lead direction and horizontal to a sealing surface, as shown in FIG. 2. In FIG. 1a, the optical path transmission route of the circular shell is perpendicular to the sealing surface, and the sealing mode is completed by adopting a high-voltage energy storage welding mode, so that a strength borne by the glass insulator 50 is low. Therefore, the traditional circular shell cannot complete metal welding with high thermal conductivity, and therefore the heat dissipation performance of the shell is poor. Furthermore, a position of the lead of the metal-glass structure is single, and the lead is of a straight-through structure, so that a connection between the chip and the lead is inconvenient. In addition, the number of the leads cannot meet the use requirement, and the cross connection between an internal chip circuit and external current cannot be realized, which means that the application of the device and the module on a whole machine is influenced.

SUMMARY

These and other problems are generally solved or circumvented, and technical advantages are generally achieved, by embodiments of the present disclosure which provide a package structure for a semiconductor device and a semiconductor device.

Technical Problem

Embodiments of the disclosure provides a package structure for a semiconductor device and a semiconductor device, which are used for solving the defects of poor heat dissipation of a package shell and single lead position in the conventional circular package structure.

TECHNICAL SOLUTION

A first aspect of an embodiment of the present disclosure provides a package structure for a semiconductor device, comprising: a metal plate, having a first surface and a second surface opposite to each other and a slot penetrating through the first surface and the second surface; a ceramic piece, for internal and external electrical connection of a packaged semiconductor device, interconnected metalized pattern being arranged inside the ceramic piece; a metal heat sink, welded on a back surface of the ceramic piece and used for disposing the semiconductor device and a matching circuit; the ceramic piece and the metal heat sink are vertically inserted into the slot and hermetically connected with the metal plate.

In one embodiment, the package structure for a semiconductor device further comprises a cap connected to the first surface or the second surface of the metal plate for supporting and sealing the semiconductor device.

In one embodiment, a lens corresponding to an optical path of the semiconductor device is provided on the cap.

In one embodiment, the ceramic piece and the metal heat sink are welded to the metal plate.

In one embodiment, the first surface and the second surface of the metal plate are circular, and steel No. 10, stainless steel or kovar metal is used.

In one embodiment, the ceramic piece is a multilayer alumina ceramic.

In one embodiment, the ceramic piece has a rectangular cross section.

In one embodiment, a shape and a size of the slot are adapted to a cross section of the ceramic piece and the metal heat sink which are inserted.

In one embodiment, on the metal plate, a recess is provided along an outer periphery of the slot, and the recess is used for limiting welding flux; or a groove is arranged on a peripheral wall, corresponding to the slot, of the ceramic piece and the metal heat sink, and the groove is used for limiting welding flux.

A second aspect of the embodiment of the present disclosure provides a semiconductor device. The semiconductor device adopts the above-described package structure.

Advantageous Effects of the Disclosure

Advantageous Effects Include:

(1) According to the disclosure, the ceramic piece replaces a glass seal; metalized interconnection is provided inside the ceramic piece for fabricating a metalized pattern having complex connection relations, and the electrical interconnection is more flexible.

(2) In the package structure, metalized wiring is carried out by using the ceramic piece. Compared with round lead machining, higher precision is achieved. The package structure has better radio frequency performance for transmission of high-frequency signals.

(3) As the metal heat sink with high heat dissipation performance is added in the package structure, the package shell has a good heat dissipation function.

(4) A metal plate—ceramic piece package structure has higher strength than the metal plate—glass package structure, which greatly improves the reliability of the shell.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

FIG. 1b is a schematic diagram of a bottom view of FIG. 1a;

Figure 1A:
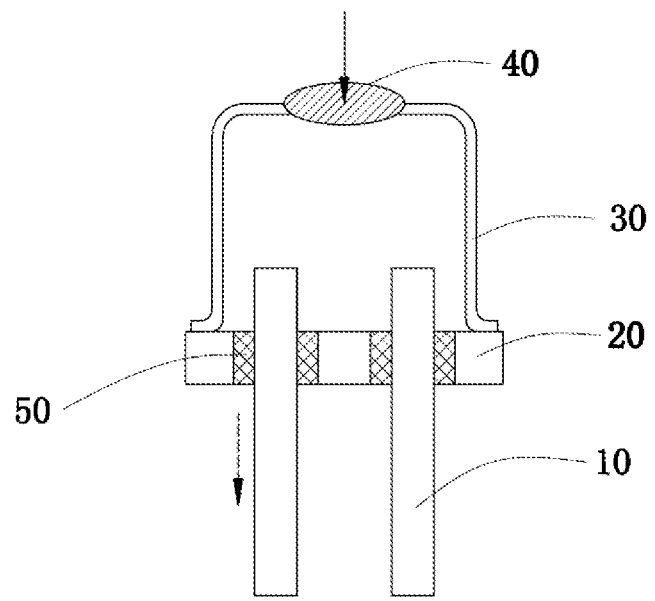
FIG. 1a is a schematic diagram of a prior art circular package structure.
Figure 1B:
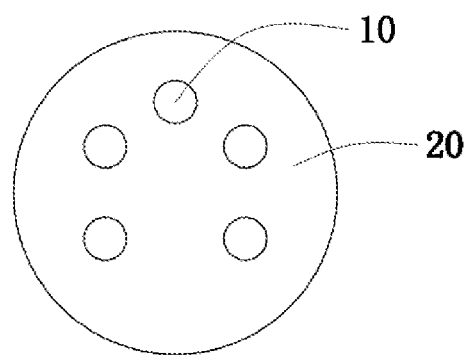
Figure 2:
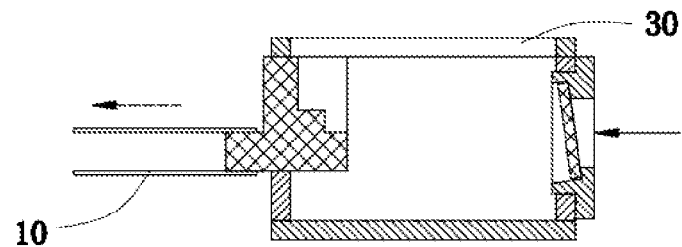
FIG. 2 is a schematic diagram of a conventional optoelectronic package shell in the prior art.

In the drawings, a solid arrow indicates an optical path direction, and a dashed arrow indicates a signal transmission direction.

Reference Numbers:

TABLE 1

| 10-lead | 20-metal plate | 30-cap |
|---|---|---|
| 40-lens | 50-glass insulator | 60-ceramic piece |
| 70-metal heat sink | | |

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In order that the technical problem to be solved by the solution, the technical solutions and the beneficial effects can be more clearly understood, the solution is described in further detail below with reference to the drawings and embodiment. It is to be understood that the specific embodiments described herein are merely illustrative of the present invention and are not intended to be limiting thereof.

The package structure provided by the embodiment of the disclosure is an improvement on the traditional circular metal plate—glass package structure. The glass insulator is replaced by a ceramic piece, a metal heat sink is additionally arranged, and the ceramic piece and the metal heat sink are vertically inserted and welded on the metal plate. A multilayer ceramic is adopted in the ceramic piece, diversification of wiring is increased, and the metal heat sink enables elements to better dissipate heat, which prolongs service life and plays a role in protecting the elements.

Figure 3:
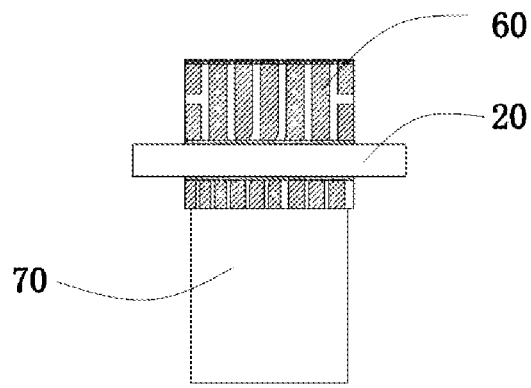
FIG. 3 is a schematic diagram of a package structure for a semiconductor device provided in an embodiment of the present disclosure.
Figure 4:
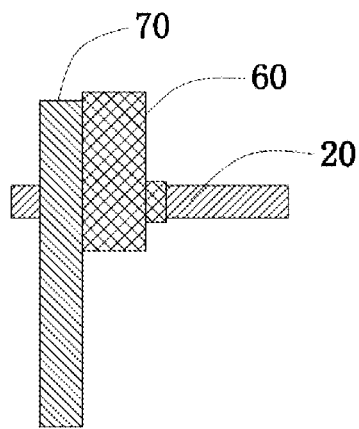
FIG. 4 is a schematic diagram of a left view of the structure of FIG. 3.
Figure 5:
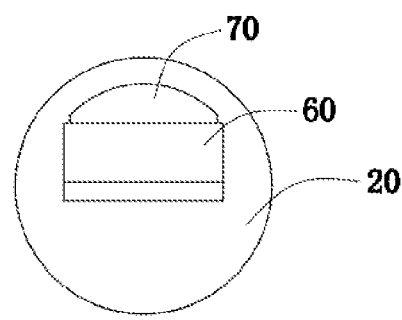
FIG. 5 is a schematic diagram of a top view of the structure of FIG. 3.

With reference to FIG. 3-FIG. 5, the package structure for a semiconductor device provided by the present disclosure will now be described in detail. The package structure comprises a metal plate 20, a ceramic piece 60 and a metal heat sink 70. The metal plate 20 has a first surface and a second surface opposite to each other and a slot penetrating through the first surface and the second surface. The ceramic piece 60 is used for internal and external electrical connection of a packaged semiconductor device. Interconnected metalized pattern is arranged inside the ceramic piece. The metal heat sink 70 is welded on a back surface of the ceramic piece 60 and used for disposing the semiconductor device and a matching circuit. The ceramic piece 60 and the metal heat sink 70 are vertically inserted into the slot and hermetically connected with the metal plate.

The embodiment of the disclosure provides a package structure of a metal—ceramic structure. Compared with the metal—glass package structure in the prior art, the present package structure not only has the advantage of more flexibility in electrical interconnection, but also has the advantage of good heat dissipation effect after the metal heat sink 70 is additionally arranged. In addition, the ceramic piece 60 and the metal heat sink 70 are vertically inserted into the slot and welded to the metal plate 20, and the metal-ceramic, metal-metal welding has higher strength and reliability.

In order to form an air-tight shell, the package structure further comprises a cap welded to the first surface or the second surface of the metal plate 20 for sealing the semiconductor device, i.e., the cap is provided according to a position of the semiconductor device. In practical use, a matching circuit can be disposed on the metal heat sink 70, and the semiconductor device is connected with the matching circuit. The cap is arranged on an outer periphery of the semiconductor device and is sealed with the metal plate 20 in an energy storage welding mode. Electrical and thermal pathways, mechanical support and air-tight environmental protection for the semiconductor device can be provided.

In other embodiments, for example, during packaging of optoelectronic devices, a lens is also provided on the cap. The lens is a light transmissive element.

Alternatively, the first surface and the second surface of the metal plate 20 are circular, and steel No. 10, stainless steel or kovar metal is used to form the metal plate to improve the reliability of the package.

The ceramic piece 60 is a multilayer alumina ceramic made by a lamination process. A composition of alumina is 90%-96%, and the alumina is prepared by adopting a multilayer ceramic process. Specifically, an aluminum oxide green ceramic chip is manufactured by adopting a casting process, wherein a metalized pattern is manufactured by using tungsten slurry or molybdenum slurry on the surface of the green ceramic chip. A plurality of layers of green ceramic chips are pressed together to form a green ceramic array. Each array comprises a plurality of green ceramic pieces, the green ceramic pieces are cut into a single green ceramic piece with cutting equipment, and then the single green ceramic piece is sintered at high temperature. The shell of the ceramic piece has high reliability in a working process with long-time temperature change.

The ceramic piece 60 has a rectangular cross section. Therefore, the semiconductor chip and the matching circuit are in close proximity to a rectangular surface, and a bonding connection of the circuit is more convenient.

In order to facilitate sealing, the slot is adapted to the ceramic piece 60 and the metal heat sink 70 inserted in the slot, that is, a shape and a size of the slot are adapted to a cross section of the ceramic piece 60 and the metal heat sink 70 which are inserted.

In one embodiment, on the metal plate 20, a recess is provided along an outer periphery of the slot. The recess is used for limiting welding flux. Welding of the ceramic piece 60 and the metal heat sink 70 to the metal plate 20 is accomplished by melting the welding flux.

In other embodiments, a groove is arranged on a peripheral wall, corresponding to the slot, of the ceramic piece 60 and the metal heat sink 70. The groove is used for limiting welding flux. Melting the welding flux also completes the welding of the ceramic piece 60 and the metal heat sink 70 to the metal plate 20.

The metal heat sink 70 may be made of tungsten copper, molybdenum copper, or copper. The metal heat sink has higher heat conductivity and strength, and can meet the heat dissipation requirement of the shell.

In summary, according to design requirements, as shown in FIG. 3, the semiconductor device and the matching circuit can be disposed on the metal heat sink 70 above the metal plate 20 or on the metal heat sink 70 below the metal plate 20. Pins of the matching circuit are electrically connected to the outside through the ceramic piece 60. The cap is set according to the position of the semiconductor device.

The embodiment of the disclosure also provides a semiconductor device which adopts the package structure of the embodiment. While the foregoing is directed to the preferred embodiment of the solution, it is not intended to limit the solution, but on the contrary, the scope of protection of the present solution intends to cover all modifications, equivalents, and improvements falling within the spirit and principle of the present solution.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A package structure for a semiconductor device, comprising:
    a metal plate having a first surface and a second surface opposite to each other, and a slot penetrating through the first surface and the second surface;
    a ceramic piece for providing an internal and external electrical connection of the semiconductor device, an interconnected metalized pattern being arranged inside the ceramic piece; and
    a metal heat sink, welded on a back surface of the ceramic piece and used for disposing the semiconductor device and an associated circuit, wherein:
    the ceramic piece and the metal heat sink are vertically inserted into the slot and hermetically connected with the metal plate, and wherein:
    on the metal plate, a recess is provided along an outer periphery of the slot, and the recess is used for limiting welding flux;
    or a groove is arranged on a peripheral wall, corresponding to the slot, of the ceramic piece and the metal heat sink, and the groove is used for limiting welding flux.

2. The package structure of claim 1, further comprising:
    a cap connected to the first surface or the second surface of the metal plate for sealing the semiconductor device.

3. The package structure of claim 2, wherein a lens corresponding to an optical path of the semiconductor device is provided on the cap.

4. The package structure of claim 1, wherein the ceramic piece and the metal heat sink are welded to the metal plate.

5. The package structure of claim 1, wherein the first surface and the second surface of the metal plate are circular, and the metal plate is formed of steel No. 10, stainless steel or kovar metal.

6. The package structure of claim 1, wherein the ceramic piece is a multilayer alumina ceramic.

7. The package structure of claim 6, wherein the ceramic piece has a rectangular cross section.

8. The package structure of claim 1, wherein a shape and a size of the slot are adapted to a cross section of the ceramic piece and the metal heat sink which are inserted into the slot.

9. The package structure of claim 1, wherein the metal heat sink is made of tungsten copper, molybdenum copper or copper.

10. A semiconductor structure configured to accommodate a semiconductor device, the semiconductor structure comprising:
    a metal plate, having a first surface and a second surface opposite to each other and a slot penetrating through the first surface and the second surface;
    a ceramic piece, for providing an internal and external electrical connection of the semiconductor device, an interconnected metalized pattern being arranged inside the ceramic piece; and
    a metal heat sink, welded on a back surface of the ceramic piece and used for disposing the semiconductor device and an associated circuit, wherein:
    the ceramic piece and the metal heat sink are vertically inserted into the slot and hermetically connected with the metal plate, and wherein:
    on the metal plate, a recess is provided along an outer periphery of the slot, and the recess is used for limiting welding flux;
    or a groove is arranged on a peripheral wall, corresponding to the slot, of the ceramic piece and the metal heat sink, and the groove is used for limiting welding flux.

* * * * *